United States Patent
Hause et al.

[11] Patent Number: 5,970,354
[45] Date of Patent: Oct. 19, 1999

[54] POLY RECESSED FABRICATION METHOD FOR DEFINING HIGH PERFORMANCE MOSFETS

[75] Inventors: Fred N. Hause, Austin; Mark I. Gardner, Cedar Creek; H. Jim Fulford, Jr., Austin, all of Tex.

[73] Assignee: Advanced Micro Devices, Inc., Sunnyvale, Calif.

[21] Appl. No.: 08/987,117

[22] Filed: Dec. 8, 1997

[51] Int. Cl.[6] .................................................. H01L 21/336
[52] U.S. Cl. ............................................ 438/305; 438/585
[58] Field of Search ..................................... 438/301, 303, 438/305, 585

[56] References Cited

U.S. PATENT DOCUMENTS

| | | |
|---|---|---|
| 4,378,627 | 4/1983 | Jambotkar . |
| 5,484,743 | 1/1996 | Ko et al. . |
| 5,677,218 | 10/1997 | Tseng . |
| 5,811,339 | 9/1998 | Tseng ......................................... 438/289 |

*Primary Examiner*—Richard Booth
*Attorney, Agent, or Firm*—Kevin L. Daffer; Conley, Rose & Tayon

[57] ABSTRACT

A method for forming a gate conductor by using a masking layer above a polysilicon layer to define the length of a gate is presented. The length of the gate may be adjusted by the use of spacers. The method includes forming a plurality of layers including a dielectric layer, a polysilicon layer and a masking layer. An opening is preferably formed in the masking layer, the opening defining the location of the gate conductor. The width of the opening may be narrowed by the use of spacers. A portion of the polysilicon layer defined by the opening is implanted with an n-type impurity. An oxide layer is formed over the implanted portion of the polysilicon layer. The polysilicon layer is etched such that a gate conductor is formed underneath the oxide layer. LDD areas and source/drain areas are subsequently formed adjacent to the gate conductor.

27 Claims, 5 Drawing Sheets

POLY RECESSED FABRICATION METHOD FOR DEFINING HIGH PERFORMANCE MOSFETS

BACKGROUND OF THE INVENTION

1. Field of the Invention

This invention relates to semiconductor processing and, more particularly, to a more accurate method for forming an ultra-small gate conductor of an MOS transistor.

2. Description of the Related Art

Fabrication of a metal-oxide semiconductor ("MOS") transistor is well known. The manufacture of an MOS transistor begins by defining active areas where the transistor will be formed. The active areas are isolated from other areas on the semiconductor substrate by various isolation structures formed upon and within the substrate. Isolation structures come in many forms. For example, the isolation structures can be formed by etching trenches into the substrate and then filling the trenches with a dielectric fill material. Isolation structures may also be formed by locally oxidizing the silicon substrate using the well recognized LOCOS technique.

Once the isolation structures are defined between transistor active areas, a gate dielectric is formed. Typically, the gate dielectric is formed by thermal oxidation of the silicon substrate. Thermal oxidation is achieved by subjecting the substrate to an oxygen-bearing, heated ambient in, for example, an oxidation furnace or a rapid thermal annealer ("RTA"). A gate conductor material is then deposited across the entire dielectric-covered substrate. The gate conductor material is preferably polycrystalline silicon, or polysilicon. The polysilicon layer is then patterned using a photolithography mask. The mask allows select removal of a light-sensitive material deposited entirely across polysilicon. The material which is exposed can, according to one embodiment, be polymerized, and that which is not exposed removed. Selective polymerization is often referred to as the "develop" stage of lithography. The regions which are non-polymerized are removed using the etch stage of lithography.

Conventional lithography used to pattern a gate conductor suffers many drawbacks. For example, selective exposure is highly dependent upon accurately placing light on the light-sensitive material. Furthermore, the light-sensitive material must consistently respond to the light with fine-line resolution. Any elevational disparity on which the polysilicon resides will result in slight changes in the point at which light impinges on the light-sensitive material. This results in a variation of the polymerized/non-polymerized boundary.

It would be advantageous to form a gate conductor without having to rely upon conventional patterning techniques. The impetus behind wanting to change gate formation methodology is principally driven from the smaller gate sizes of modern day integrated circuits. As gate lengths and widths become smaller to accommodate higher density circuits, it is necessary that the relatively small gate conductors be accurately produced with minimal misalignment or size variation. Any changes in the placement and geometry of a gate conductor can have negative performance effects on the ensuing MOS transistor.

To lower the resistivity of the polysilicon gate, and therefore increase the speed of the transistor it is desirable that the entire polysilicon layer forming the gate be substantially doped. During a typical transistor formation process the polysilicon gate is typically doped at the same time as the source/drain areas in order to make the process more efficient. This simultaneous implantation may cause difficulties since the implant depth of the gate is typically deeper than the desired implant depth of the source/drain. It is therefore desirable to devise a method which allows the implant depth of the gate to be conducted independently of the implantation of the source/drain.

It is further desirable to produce a gate conductor which is extremely small in channel length. The small gate conductor must be one which is formed outside of the normal lithography limitations. In order to accurately produce a small gate conductor, a process must be used which avoids the limitations of lithographic exposure, develop and etch cycles applied for defining conventional gate conductors upon a gate dielectric. In order for a transistor which employs a relatively small gate conductor to achieve commercial success, improvements must be undertaken not only to the lithography procedure but also to the LDD structure itself. As Leff decreases commensurate with gate conductor size, LDD implants must be carefully controlled so as not to encroach into the relatively short channel short channel while at the same time source/drain implants must be sufficiently concentrated to minimize HCE. Still further, the spacing of the source/drain implants must not be excessive, especially at the source-side of the channel, where parasitic resistance is most problematic.

SUMMARY OF THE INVENTION

The problems identified above are in large part addressed by the method hereof for forming gate structures upon a semiconductor substrate. That is, the present invention contemplates the formation of a gate conductor by using a masking layer above a polysilicon layer to define the length of a gate. The length of the gate may be adjusted by the use of spacers.

According to one embodiment, a plurality of layers are formed upon a silicon substrate. Initially a dielectric layer may be either deposited or grown upon the silicon substrate. Deposited upon oxide is a gate material preferably made of polycrystalline silicon which is preferably rendered conductive by a subsequent implanting step. Another oxide layer may be thermally grown on the polysilicon layer. A dielectric layer, preferably nitride ($Si_3N_4$), is preferably deposited across the oxide layer.

A photoresist layer serves to allow access to portions of the nitride layer which, after selective removal, thereafter serves as a masking layer in the subsequent steps. After removing portions of the photoresist material, the nitride layer is preferably removed in regions where the nitride layer is exposed. Preferably, etching is stopped when the oxide layer is reached, leaving a layer of oxide on the bottom floor of the etched opening.

After removal of the exposed portion of the nitride layer, the exposed polysilicon layer at the base of the opening is preferably doped by ion implantation using an n-type impurity. Preferably arsenic is used as the n-type impurity, although other impurities, including phosphorus may be used. The photoresist layer and/or the nitride layer together preferably inhibit implantation of the n-type impurity into the polysilicon layer underneath the unremoved layers. There are a number of advantages achieved by ion implantation of the gate at this early stage. One advantage may be that the depth of the impurities implanted within the gate may be adjusted to the desired level without effecting the depth of the source/drain impurities. Another advantage may be that by doping the gate at this early stage it may be possible to form a plurality of NMOS and PMOS FET's (i.e., in a CMOS circuit) simultaneously.

After ion implantation is completed the photoresist layer is removed. The substrate may then be subjected to an annealing process e.g., a rapid thermal anneal, to activate and distribute the implanted ions throughout the implanted portion of the polysilicon layer.

Further oxidation of the polysilicon layer may be performed. The oxidation may be performed on the polysilicon after the photoresist layer has been removed. This oxidation of the gate conductor region may be used to define the region which will be subsequently converted into the gate of a transistor. The oxidation of the gate conductor region is enhanced by the prior implantation of an n-type dopant. This enhancement may be used to control the lateral oxidation, i.e., oxidation underneath the nitride masking layer.

The nitride masking layer is preferably stripped from the oxide layer. The oxide layer is subsequently etched such that the oxide layer over the undoped polysilicon is removed. Since the oxide over the gate conductor region is preferably thicker than the oxide over the undoped regions, the oxide etch may be stopped at a point such that a portion of the oxide remains over the gate conductor region. The unmasked polysilicon regions, i.e., the polysilicon regions that are not protected by a masking oxide layer are now removed. In this manner the gate is produced on the surface of the oxide layer.

An LDD area and source/drain regions may be subsequently implanted into the regions adjacent to the gate.

In another embodiment, spacer structures may be used to accomplish the formation of ultra-short gate lengths. A plurality of layers are sequentially formed upon a silicon substrate. Initially a dielectric layer is either deposited or grown from a heated, oxygen bearing source. Deposited upon oxide is a gate material preferably made of polycrystalline silicon which will later be rendered conductive by a subsequent implanting step. Another oxide layer may be thermally grown on the polysilicon layer. Additionally a dielectric layer, preferably nitride ($Si_3N_4$), may be deposited across the oxide layer.

A photoresist layer serves to mask etch access to the portions of the nitride layer which will serve as a masking layer in the subsequent steps. After removing portions of the photoresist material, the nitride layer is preferably removed in regions where the nitride layer is exposed. Preferably, the etching is stopped when the oxide layer is reached, leaving a layer of oxide on the bottom floor of the etched opening.

The width of the gate conductor, (i.e., the physical gate length) to be formed in subsequent steps may be controlled at this stage by forming spacers upon the sidewalls of the nitride layer. The width of the opening between the nitride stacks determines the eventual width of the gate conductor. Up to this point the width may be controlled by the photolithographic process. It may be desirable to create gate structures with widths substantially smaller than can be obtained using the photolithographic process.

A dielectric material may be CVD deposited across exposed portions of the nitride layer and within the opening. An anisotropic etch may be used to clear the CVD dielectric from horizontal surfaces leaving spacers upon the nitride vertical sidewalls.

After forming the spacers, the polysilicon layer underneath the opening may be doped by ion implantation using, e.g., an n-type impurity. Preferably arsenic is used as the n-type impurity, although other impurities, including phosphorus may be used. The substrate may then be subjected to an annealing process e.g., a rapid thermal anneal, to activate and distribute the implanted ions throughout the implanted portion of the polysilicon layer.

Further oxidation of the polysilicon layer may be performed. This oxidation of the gate conductor region is used to define the region which will be subsequently converted into the gate of a transistor. The oxide layer is preferably formed in the polysilicon layer defined by the spacers, thus giving rise to a gate structure having a length smaller than that obtainable by photolithographic processes.

The nitride masking layer is preferably stripped from the oxide layer. The oxide layer is preferably etched such that the oxide layer over the undoped polysilicon is removed. Since the oxide over the gate conductor region is preferably thicker than the oxide over the undoped regions, the oxide etch may be stopped at a point such that a portion of the oxide remains over the gate conductor region. The unmasked polysilicon regions, i.e., the polysilicon regions that are not protected by a masking oxide layer are now removed. In this manner the gate is produced on the surface of the oxide layer.

An LDD area and source/drain regions may be subsequently implanted into the regions adjacent to the gate.

BRIEF DESCRIPTION OF THE DRAWINGS

Other objects and advantages of the invention will become apparent upon reading the following detailed description and upon reference to the accompanying drawings in which.

Figure 1:
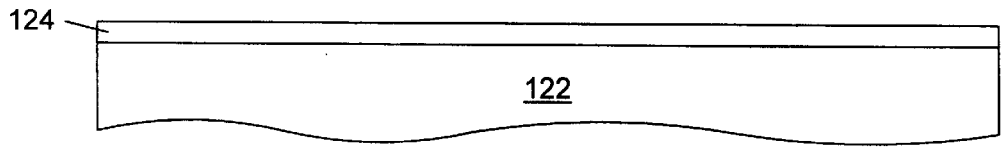
FIG. 1 is a partial cross-sectional view of a semiconductor topography, wherein an oxide layer is formed across a semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a semiconductor substrate 122 is provided which comprises single crystalline silicon. Although not shown in the depicted cross-section of substrate 122, dielectric isolation regions, such as trench isolation structures may be arranged spaced distances apart within substrate 122 for dielectrically isolating the ensuing active areas. A dielectric layer 124 is preferably deposited entirely across substrate 122. The dielectric 124 is either deposited or grown from a heated, oxygen bearing source. Gate dielectric 124 is preferably formed in a thermal oxidation furnace using temperatures of approximately 700° to 900° C. for a relatively short time (e.g., less than 60 minutes). It is preferred that gate dielectric 124 be grown to a thickness of approximately 15–200 angstroms.

Figure 2:
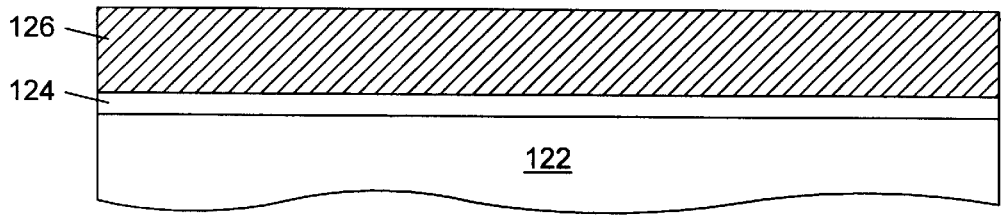
FIG. 2 is a partial cross-sectional view of the semiconductor topography according to a processing step subsequent to FIG. 1, wherein a polysilicon layer formed across the semiconductor substrate.

Deposited upon oxide 124 is a gate material 126, as depicted in FIG. 2, preferably made of polycrystalline silicon which will later be rendered conductive by a subsequent implanting step. The polysilicon layer 126 is preferably deposited using a low pressure chemical vapor deposition ("CVD") process. The polysilicon layer 126 is preferably deposited to a thickness of approximately 100 to 150 angstroms. The upper surface of polysilicon layer 126 may then be polished using e.g., mechanical polishing or chemical-mechanical polishing to substantially reduce its surface roughness. As a result, the thickness of polysilicon layer 126 may be reduced by about 50 Å to a uniform thickness across the dielectric surface.

Figure 3:
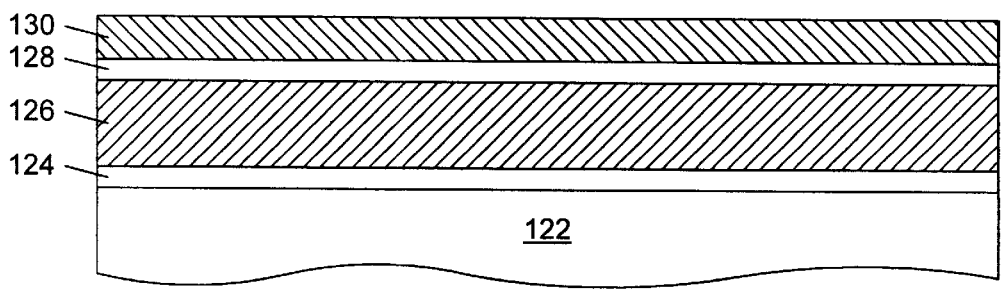
FIG. 3 is a partial cross-sectional view of the semiconductor topography according to a processing step subsequent to FIG. 2, wherein a dielectric masking layer which includes a nitride layer overlying an oxide layer is formed across a semiconductor substrate.

Another oxide layer 128, depicted in FIG. 3, may be thermally grown on the polysilicon layer 126. The oxide layer 128 may also be CVD deposited upon the polysilicon layer 126. Additionally a masking layer 130, preferably nitride ($Si_3N_4$), may be deposited across oxide layer 128. The oxide deposition and the nitride deposition may be performed using, e.g., a horizontal tube LPCVD reactor. When a nitride/oxide stack, as depicted in FIG. 3 is used, the oxide layer 128 serves as a "pad oxide" to reduce inherent stresses that exist between CVD nitride on a polysilicon substrate. In the present invention, either the nitride layer alone, or the oxide/nitride stack may be used as a masking layer for the subsequent steps.

Figure 4:
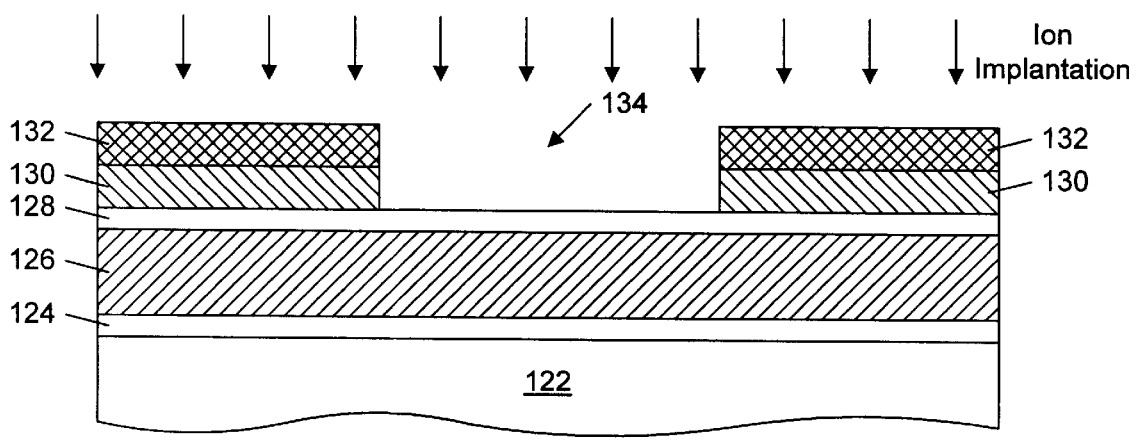
FIG. 4 is a partial cross-sectional view of the semiconductor topography according to a processing step subsequent to FIG. 3, wherein an opening defined by a photoresist layer is etched vertically through the photoresist layer and the nitride layer, followed by an ion implantation step.

FIG. 4 illustrates deposition and selective removal of a photoresist layer 132. Photoresist layer 132 is preferably patterned using well-known lithography techniques to expose a portion of the nitride layer 130. Photoresist layer 132 serves to mask etch access to the portions of the nitride layer 130 which will serve as a masking layer in the subsequent steps. After removal of portions of the photoresist material 132, nitride layer 130 is preferably removed in regions where the nitride layer 130 is exposed. An etchant is chosen which is selective to removing nitride 130 but not the developed photoresist material 132, e.g., a dry, plasma etch. Etching is preferably continued until opening 134 is formed extending down to the oxide layer 128. The oxide layer may be removed by a subsequent etch or may be removed during the nitride etching. Preferably the etching is stopped when the oxide layer 128 is reached, leaving a layer of oxide on the bottom floor of etched opening 134.

Figure 5:
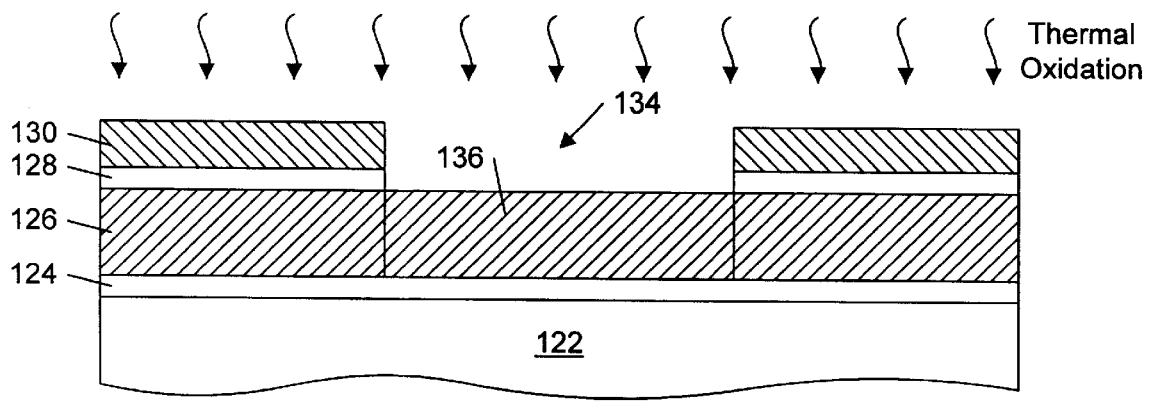
FIG. 5 is a partial cross-sectional view of the semiconductor topography according to a processing step subsequent to FIG. 4, wherein the photoresist layer is removed prior to thermally growing an oxide layer within a gate conductor region of the polysilicon.

After removal of the exposed portion of the nitride layer 130, the polysilicon layer 126 underneath the opening 134 is preferably doped by ion implantation using an n-type impurity. The doping procedure is preferably accomplished using a high current implanter at a dosage of at least $10^{14}/cm^2$. Preferably, arsenic is used as the n-type impurity although other impurities, including phosphorus, may be used. The photoresist layer 132 and the nitride layer 130 together preferably inhibit implantation of the n-type impurity into the underlying polysilicon layer 126. The n-type impurities are preferably implanted in the region underneath the opening 134 where the photoresist layer 132 and the nitride layer 134 are not present, as depicted in FIG. 5.

The gate conductor region 136, will subsequently be converted into the gate for a MOS transistor. There are a number of advantages achieved by ion implantation of the gate at this early stage. One advantage is that the depth of the impurities implanted within the gate may be adjusted to the desired level without effecting the depth of the source/drain impurities. Since the source/drain are masked from the ion implantation by the layers formed above these regions, substantially no implantation occurs in these regions. High energy ion implantation may therefore be used without increasing the depth of implantation at the source and drain. Later, after the gate has been doped to the proper level, the ion implantation of the source/drain areas may be performed such that very shallow source drain areas are obtained. In this manner the VT of the transistor may be controlled by the processing method.

Additionally, in a CMOS environment, both NMOS and PMOS FET's use n-type doped gates. They are then differentiated from each other by forming either n-type or p-type source/drain regions, respectively, adjacent to the gate. By doping the gate at this early stage it may be possible to form a plurality of NMOS and PMOS FET's simultaneously. The gate structures are doped according to the method previously described. The doping of the source/drain regions may then be accomplished at a later time by using a series of masking steps. This may help to make the formation of the desired integrated circuit more efficient.

The photoresist layer 132 is preferably left on the nitride layer prior to implantation of the n-type impurity. In this manner the nitride/photoresist stack 130/132 may more effectively inhibit implantation of the impurity in portions of the polysilicon layer underneath the stack. Both photoresist and nitride are well known masking materials for ion implantation processing steps. By leaving the photoresist layer 132 on the nitride layer 130, an effective masking layer is created due to the increased thickness of the combined layers. The photoresist layer 132 is preferably removed after implantation.

The oxide layer 128 is preferably left on top of the polysilicon layer 126 during the implantation procedure. The oxide layer may provide a screen against contamination of the polysilicon layer 126 by metals or other impurities during the implantation. Additionally the oxide layer may serve as a protective layer against physical damage of the polysilicon layer during the implantation sequence.

After ion implantation is completed, the photoresist layer is removed as depicted in FIG. 5. The substrate may then be subjected to an annealing process, e.g., a rapid thermal anneal, to activate and distribute the implanted ions throughout the implanted portion of the polysilicon layer. Typically, most of the implanted ions do not occupy substitutional sites after implantation. An annealing process is preferably used to bring about electrical activation of the gate conductor region 136. The rapid thermal anneal is preferably accomplished at a temperature of about 1000° C. The use of rapid thermal anneal techniques will preferably minimize the distribution of the impurities throughout the polysilicon layer.

Figure 6:
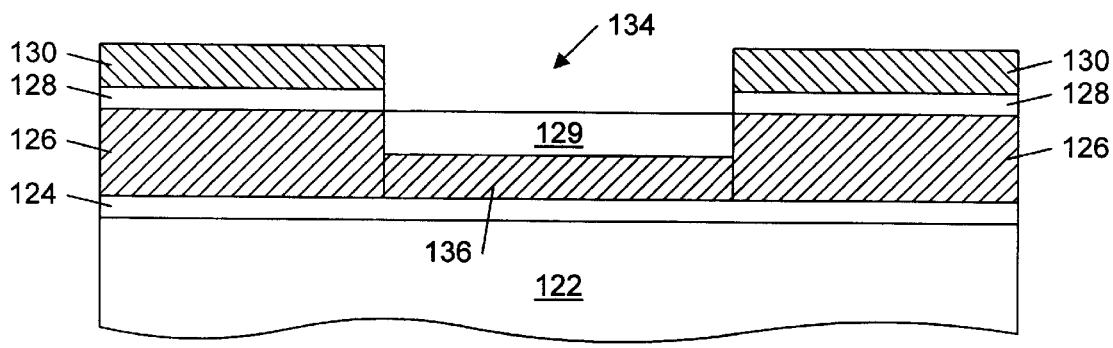
FIG. 6 is a partial cross-sectional view of the semiconductor topography according to a processing step subsequent to FIG. 5, wherein the oxide layer is thermally grown within the gate conductor region of the polysilicon.

Further oxidation of the polysilicon layer may be performed. The oxidation may be performed on the polysilicon after the photoresist layer has been removed. Turning to FIG. 6, the oxidation of the gate conductor region 136 is used to define the region which will be subsequently converted into the gate of a transistor. Additional oxide layer 129 is preferably thermally grown on the polysilicon layer 126. The masking nitride layer 130 may prevent substantial oxidation in the regions underneath this layer. The gate conductor region 136 not covered by the nitride masking layer 130 is preferably oxidized such that the oxide layer has a width which is substantially greater that the oxide layer 126 on either side of the gate.

The oxidation of the gate conductor region 136 may be enhanced by the prior implantation of an n-type dopant. It is well known that Group V dopants such as arsenic or phosphorus enhance the oxidation rate of silicon. This enhancement may be used to control the lateral oxidation, i.e., oxidation underneath the nitride masking layer, of the polysilicon layer. Since the doped region oxidizes faster than the non-doped regions the position of the new oxide, and hence the length of the gate may be more effectively controlled. The enhanced rate of oxidation allows shorter oxidation times which may substantially prevent lateral oxidation.

Figure 7:
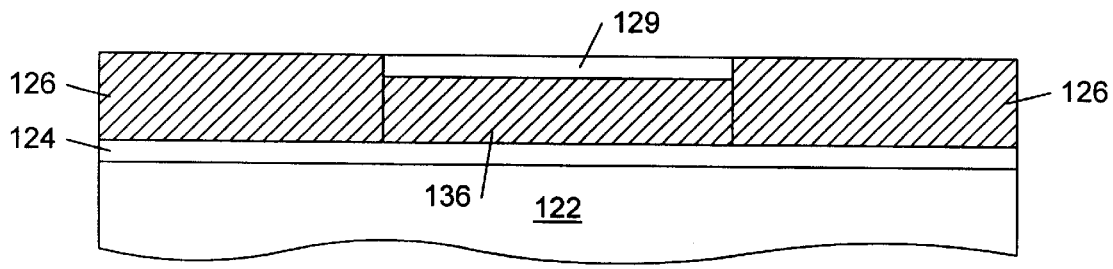
FIG. 7 is a partial cross-sectional view of the semiconductor topography according to a processing step subsequent to FIG. 6, wherein the masking layer is removed to expose a portion of the polysilicon layer.

Turning now to FIG. 7, the nitride masking layer 130 is preferably stripped from the oxide layer. Preferably, removal is achieved by a dry etch process, e.g., a plasma etch. The process conditions may be chosen such that the nitride layer 130 is removed with high selectivity against removal of the underlying oxide layer 128. A plasma etch process using a $NF_3$ plasma is preferred. The oxide layer may be subsequently etched such that the oxide layer 128 over the undoped polysilicon 126 is removed. Preferably, removal is achieved by a dry etch process, e.g., a plasma etch. During removal of the oxide layer 128 the oxide etch is preferably stopped at a point such that a portion of the oxidized polysilicon region 129 remains. This may be readily accomplished since the oxidized polysilicon region 129 over the gate conductor region 136 has a depth greater than the depth of the oxide 128 over the undoped regions. A plasma etch process using a fluorocarbon-containing plasma is preferred.

Figure 8:
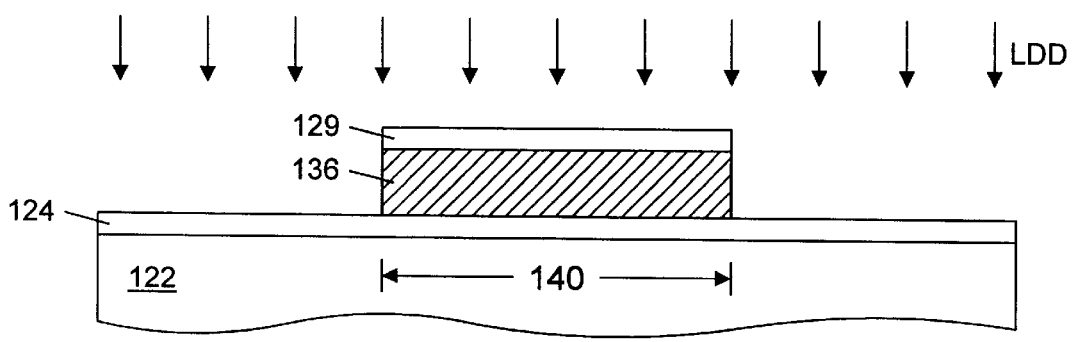
FIG. 8 is a partial cross-sectional view of the semiconductor topography according to a processing step subsequent to FIG. 7, wherein the exposed portion of the polysilicon layer is removed, prior to implantation of the LDD areas, to form a gate conductor.

FIG. 8 illustrates removal of the unmasked polysilicon regions 126, i.e., the polysilicon regions that are not protected by the oxidized polysilicon layer 129. Preferably, removal is achieved by a dry etch process, e.g., a plasma etch. The process conditions are chosen such that the polysilicon layer is preferably removed with high selectivity against removal of the oxidized polysilicon layer 129. A plasma etch process using a chlorine-fluorine plasma is preferred. In this manner the gate conductor 136 may be produced on the surface of the oxide layer 124. Referring back to FIG. 4, the length of the gate conductor 136 may be ultimately controlled by the size of the opening formed in the nitride layer 130.

Figure 9:
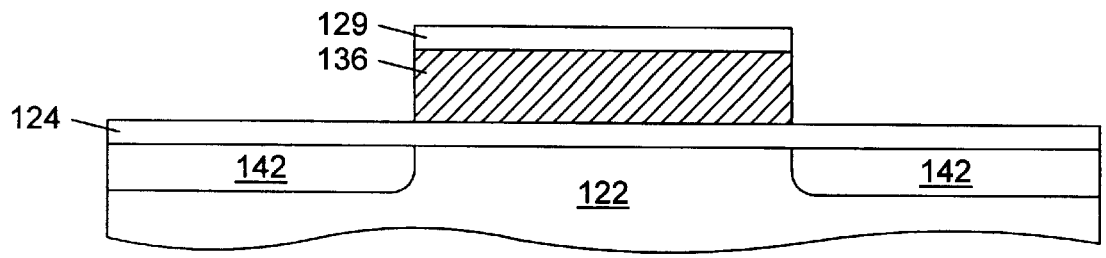
FIG. 9 is a partial cross-sectional view of the semiconductor topography according to a processing step subsequent to FIG. 8, wherein LDD areas are formed within the silicon substrate adjacent to the gate conductor.

An LDD implant may now be forwarded into substrate 122. Gate conductor 136 and gate dielectric 124 may serve to mask the LDD implant from channel region 140 to form LDD areas 142 as depicted in FIG. 9. The LDD implant may be n-type or p-type depending on the type of transistor to be formed. The gate conductor 136 preferably serves to align the LDD implant 142 adjacent to the gate conductor.

Figure 10:
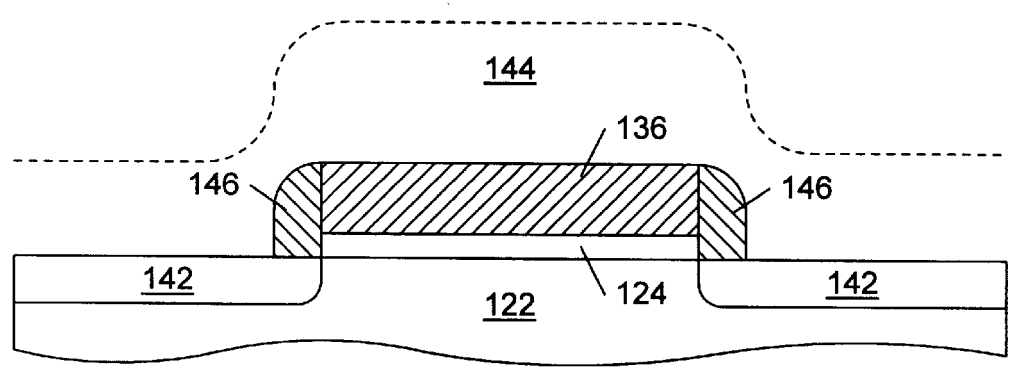
FIG. 10 is a partial cross-sectional view of the semiconductor topography according to a processing step subsequent to FIG. 9, wherein oxide spacers are formed on the substantially vertical sidewalls of the gate conductor.

FIG. 10 illustrates deposition of a partially sacrificial material 144. Material 144 preferably comprises oxide deposited from a CVD apparatus. By using oxide the previously formed oxide layer may be incorporated into the newly deposited oxide layer. Material 144 is preferably deposited across the entire semiconductor topography to form a conformal layer. After deposition, material 144 preferably undergoes an anisotropic etch. An anisotropic etch, such as a plasma etch, employs both physical and chemical removal mechanisms. Ions are bombarded at an angle substantially perpendicular to substrate 122 upper surface. This causes substantially horizontal surfaces to be removed faster than substantially vertical surfaces. During this etching procedure the oxide layers 124 and 128 above the LDD areas 142 and above the gate conductor 136, respectively, are preferably removed. The only regions of material 144 which remain may be those regions near substantially vertical surfaces. The remaining regions of material 144 are henceforth referred to as oxide spacers 146.

Figure 11:
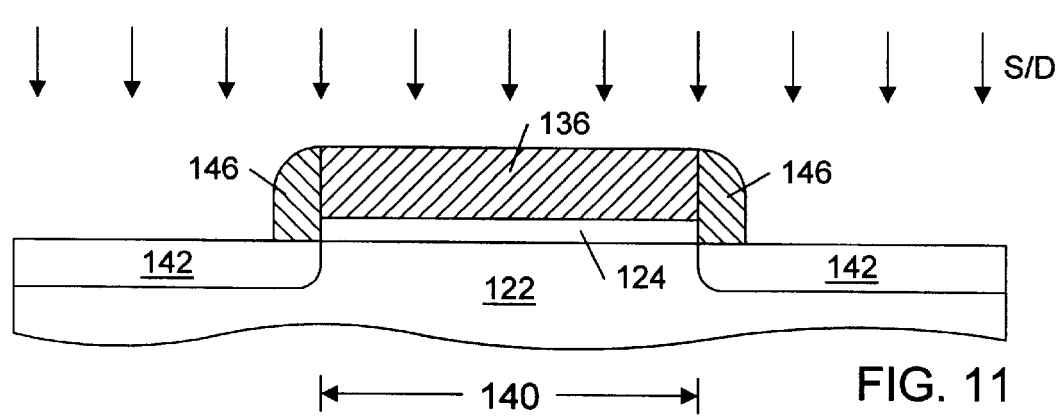
FIG. 11 is a partial cross-sectional view of the semiconductor topography according to a processing step subsequent to FIG. 10, wherein source/drain regions are implanted into the exposed portions of the silicon substrate.
Figure 12:
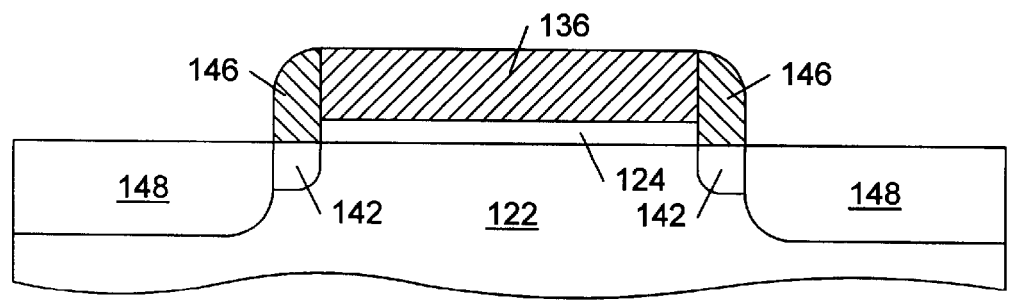
FIG. 12 is a partial cross-sectional view of the semiconductor topography according to a processing step subsequent to FIG. 11, wherein source/drain areas are formed within the silicon substrate adjacent to the oxide spacers.

FIG. 11 illustrates a source/drain implant into substrate 122. Gate conductor 136, gate dielectric 124, and oxide spacers 146 preferably serve to mask the source/drain implant from channel region 140 and a portion of the LDD areas under the oxide spacers. The source/drain implant is preferably of the same dopant species as the LDD implant, albeit at a higher concentration and energy than the LDD implants. Resulting from the source drain implant, source/drain regions 148 are produced, as depicted in FIG. 12. The oxide spacers 146 serve to align the source/drain regions 148 a spaced distance from the gate conductor 136.

FIGS. 13–19 depict an alternate processing sequence to that of FIGS. 1–13. Specifically, FIGS. 13–19 illustrate the formation of a gate conductor having a length smaller than that obtainable by photolithographic processes alone. Spacer structures are used to accomplished the formation of narrow gate conductors.

Figure 13:
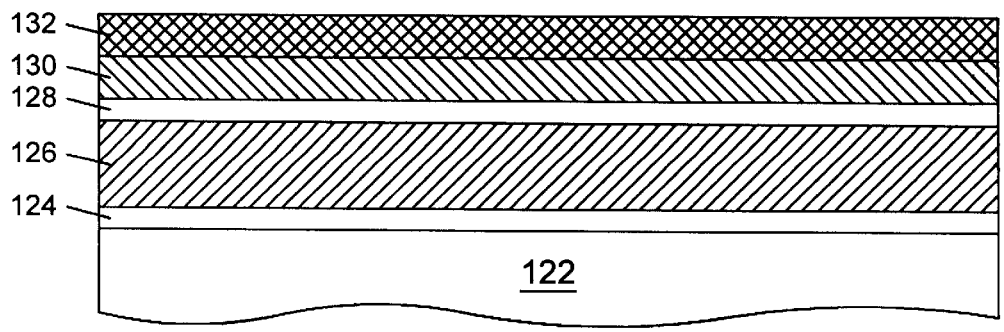
FIG. 13 is a partial cross-sectional view of a semiconductor topography, wherein an oxide layer, a polysilicon layer, a dielectric masking layer which includes a nitride layer overlying an oxide layer, and a photoresist layer are formed above a silicon substrate.

Turning to FIG. 13, a semiconductor substrate 122 is provided which comprises single crystalline silicon. Although not shown in the depicted cross-section of substrate 122, dielectric isolation regions, such as trench isolation structures may be arranged spaced distances apart within the substrate for dielectrically isolating the ensuing active areas. A dielectric layer 124 is preferably deposited entirely across substrate 122. The dielectric 124 may be either deposited or grown from a heated, oxygen bearing source.

Deposited upon oxide 124 is a gate material 126 preferably made of polycrystalline silicon which may be later rendered conductive by a subsequent implanting step. The polysilicon layer 126 is preferably deposited using a low pressure chemical vapor deposition ("CVD") process.

Another oxide layer 128 may be thermally grown on the polysilicon layer 126. The oxide layer 128 may also be CVD deposited upon the polysilicon layer 126. Additionally a masking layer 130, preferably nitride ($Si_3N_4$), may be deposited across oxide layer 128. The oxide deposition and the nitride deposition may be performed using, e.g., a horizontal tube LPCVD reactor. In the present invention, either the nitride layer alone, or the oxide/nitride stack may be used as a masking layer for the subsequent steps. A photoresist layer 132 is preferably deposited over the nitride layer 130.

Figure 14:
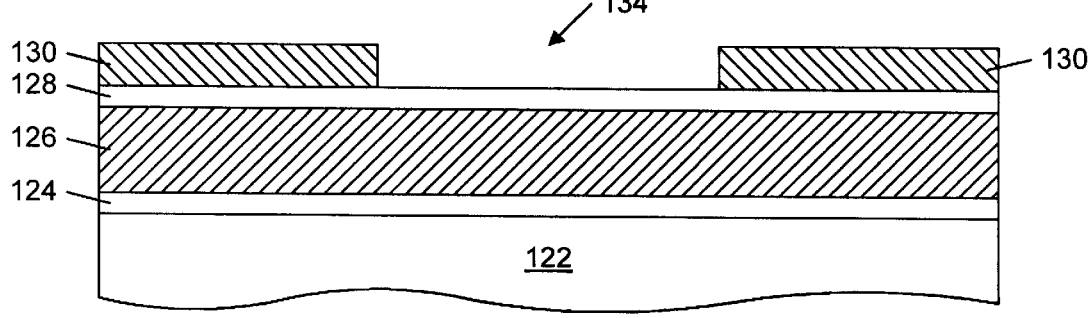
FIG. 14 is a partial cross-sectional view of the semiconductor topography according to a processing step subsequent to FIG. 13, wherein an opening is etched vertically through the nitride layer.

FIG. 14 illustrates the selective removal of a portion of the nitride layer 130. Photoresist layer 132 is preferably patterned using well-known lithography techniques to expose a portion of the nitride layer 130. Photoresist layer 132 may serve to mask etch access to the portions of the nitride layer 130 which will serve as a masking layer in the subsequent steps. After removal of portions of the photoresist material 132, nitride layer 130 is preferably removed in regions where the nitride layer 130 is exposed. An etchant is chosen which is preferably selective to removing nitride 130 but not the developed photoresist material 132, e.g., a dry, plasma etch. Etching is preferably continued until opening 134 is formed extending down to the oxide layer 128. The oxide layer may be removed by a subsequent etch or may be removed during the nitride etching. Preferably the etching is stopped when the oxide layer 128 is reached, leaving a layer of oxide on the bottom floor of etched opening 134. The photoresist layer is preferably removed from the nitride layer 130 before subsequent processing.

The width of the gate conductor to be formed in subsequent steps may be controlled at this stage by the formation of spacer structures upon the sidewalls of the nitride layer 130. The width of the opening between the nitride stacks 130 has a direct relation to the eventual width of the gate conductor. Up to this point the width may be controlled by the photolithographic process. It may be desirable to create gate structures with widths substantially smaller than can be obtained using the photolithographic process.

Figure 15:
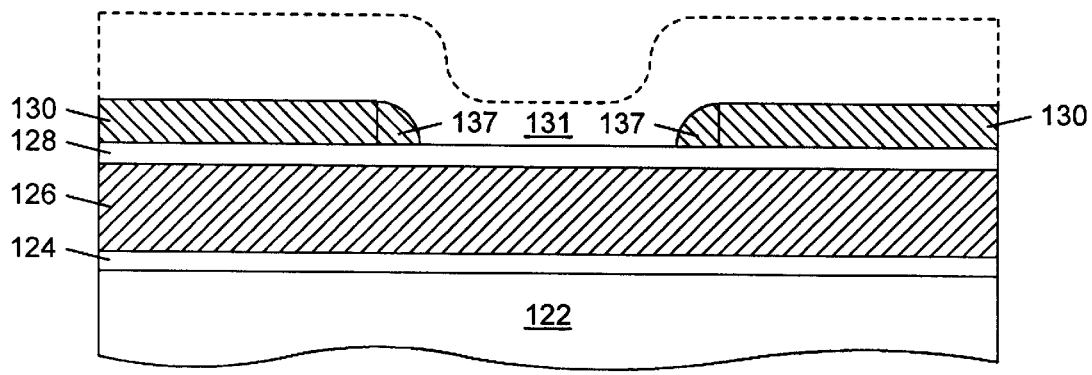
FIG. 15 is a partial cross-sectional view of the semiconductor topography according to a processing step subsequent to FIG. 14, wherein nitride spacers are formed on the substantially vertical sidewalls of the opening.

Turning now to FIG. 15 a dielectric material 131, such as oxide or nitride, may be CVD deposited across exposed portions of the nitride layer 130 and within the opening 134. Preferably, nitride is used as the spacer material to allow the material of the spacer structures to match the material of the masking nitride layer 130. An anisotropic etch, such as a plasma etch, employs both physical and chemical removal mechanisms. Ions are bombarded at an angle substantially perpendicular to substrate 122 upper surface. This causes substantially horizontal surfaces to be removed faster than substantially vertical surfaces. The spacer structures 137 are in this manner formed upon the opposed sidewalls surfaces within the opening 134 of the nitride layer 130. The use of these spacers will allow the length of the gate to be adjusted to distances much smaller than that obtainable by the photolithographic process.

Figure 16:
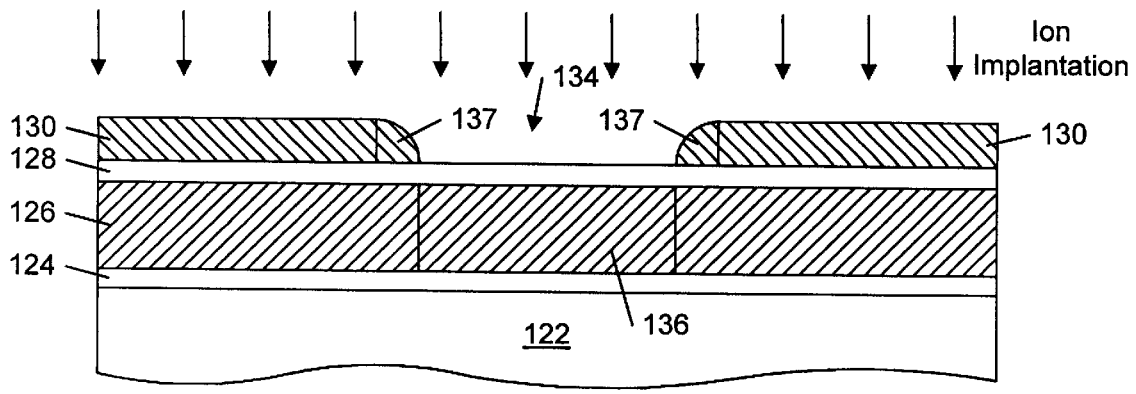
FIG. 16 is a partial cross-sectional view of the semiconductor topography according to a processing step subsequent to FIG. 15, wherein an ion implantation step is performed to produce a gate conductor region, defined by the nitride spacers, within the polysilicon layer.

After formation of the spacers 137 the polysilicon layer 126 underneath the opening 134 is doped by ion implantation using an n-type impurity. The doping procedure is preferably accomplished using a high current implanter at a dosage of at least $10^{16}/cm^2$. Preferably arsenic is used as the n-type impurity, although other impurities, including phosphorus may be used. The nitride layer 130 and the spacers 137 preferably inhibit implantation of the n-type impurity into the underlying polysilicon layer 126. In the region underneath the opening 134 where the nitride layer 134 and spacers 137 are not present, the n-type impurities are preferably implanted to form the gate conductor region 136, as depicted in FIG. 16.

Figure 17:
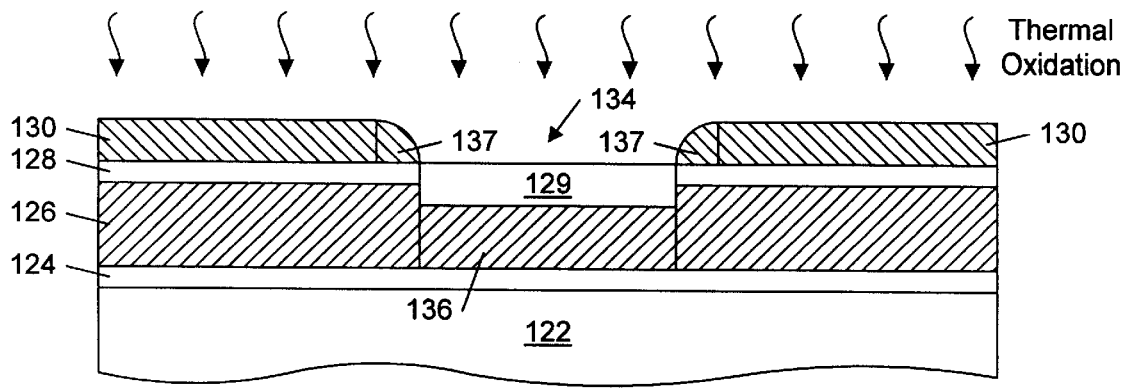
FIG. 17 is a partial cross-sectional view of the semiconductor topography according to a processing step subsequent to FIG. 16, wherein the oxide layer is thermally grown within the gate conductor region of the polysilicon.

Further oxidation of the polysilicon layer may be performed. Turning to FIG. 17, the oxidation of the gate conductor region 136 is used to define the region which will be subsequently converted into the gate of a transistor. Additional oxide layer 129 is preferably thermally grown on the polysilicon layer 126. The masking nitride layer 130 prevents substantial oxidation in the regions underneath this layer. The gate conductor region 136 not covered by the nitride masking layer 130 is preferably oxidized such that the oxide layer has a width which is substantially greater that the oxide layer 126 on either side of the gate.

Figure 18:
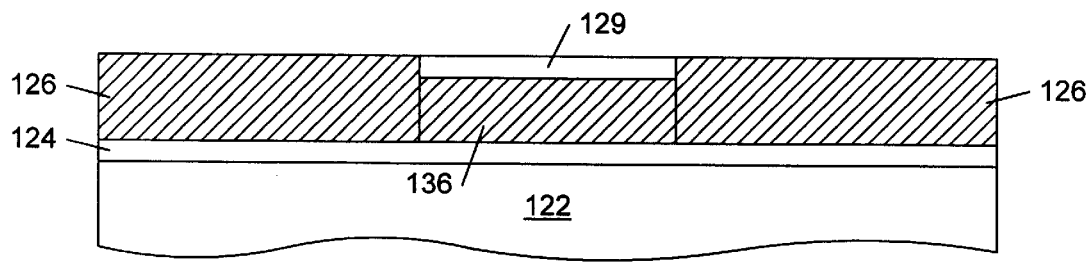
FIG. 18 is a partial cross-sectional view of the semiconductor topography according to a processing step subsequent to FIG. 17, wherein the masking layer is removed to expose a portion of the polysilicon layer.

Turning now to FIG. 18, the nitride masking layer 130 is preferably stripped from the oxide layer. Preferably, removal is achieved by a dry etch process, e.g., a plasma etch. The process conditions are chosen such that the nitride layer 130 is preferably removed with high selectivity against removal of the underlying oxide layer 128. A plasma etch process using a $NF_3$ plasma is preferred. The spacers 137 are preferably removed during the removal of the nitride layer 130. The oxide layer is subsequently etched such that the oxide layer 128 over the undoped polysilicon 126 is preferably removed. Preferably, removal is achieved by a dry etch process, e.g., a plasma etch. During removal of the oxide layer 128 the oxide etch is preferably stopped at a point such that a portion of the oxidized polysilicon region 129 remains. This may be readily accomplished since the oxidized polysilicon region 129 over the gate conductor region 136 has a depth greater than the depth of the oxide 128 over the undoped regions. A plasma etch process using a fluorocarbon-containing plasma is preferred.

Figure 19:
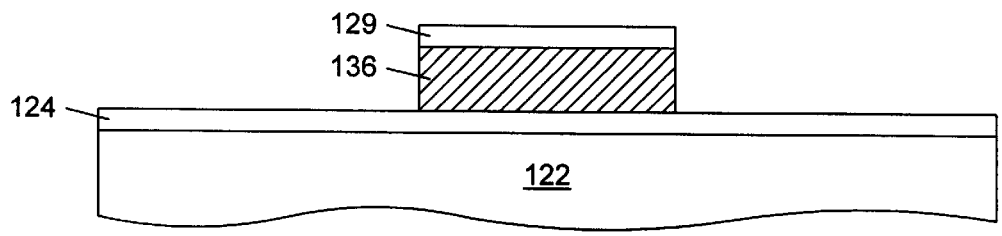
FIG. 19 is a partial cross-sectional view of the semiconductor topography according to a processing step subsequent to FIG. 18, wherein the exposed portion of the polysilicon layer is removed to form a gate conductor.

FIG. 19 illustrates removal of the unmasked polysilicon regions 126, i.e., the polysilicon regions that are not protected by a masking oxide layer 129. Preferably, removal is achieved by a dry etch process, e.g., a plasma etch. The process conditions are chosen such that the polysilicon layer is preferably removed with high selectivity against removal of the oxide layer 129. A plasma etch process using a chlorine-fluorine plasma is preferred. In this manner the gate conductor 136 may be produced on the surface of the oxide layer 124. Referring back to FIG. 15, the length of the gate conductor 136 is ultimately controlled by the size of the opening 134 formed between the spacers 137.

The subsequent formation of the LDD areas and the source/drain regions may be accomplished using the same sequence of steps depicted in FIGS. 8–12.

It will be appreciated to those skilled in the art having the benefit of this disclosure that this invention is believed to be capable of forming an ultra-small gate conductor of an MOS transistor. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming a transistor, comprising:
   providing a semiconductor substrate comprising a dielectric layer, a gate material layer, and a masking layer sequentially formed upon the semiconductor substrate;
   forming an opening within the masking layer;
   implanting an impurity into a portion of the gate material layer defined by the opening, wherein a source/drain region within the semiconductor substrate is substantially free of the impurity;
   growing an oxide layer in the portion of the gate material layer defined by the opening; and
   etching the gate material layer to form a gate conductor, wherein the gate conductor is formed underneath the grown oxide layer.

2. The method of claim 1 wherein the dielectric layer comprises thermally grown silicon dioxide.

3. The method of claim 1 wherein the dielectric layer comprises chemical vapor deposited silicon dioxide.

4. The method of claim 1 wherein the gate material comprises polysilicon.

5. The method of claim 1 wherein the masking layer comprises silicon nitride.

6. The method of claim 1 wherein the masking layer comprises silicon nitride configured upon an oxide layer.

7. The method of claim 1 wherein the forming of an opening comprises:
   depositing a photoresist layer on an upper surface of the masking layer;
   directing an exposure source of the photolithography apparatus at the photoresist layer through a photomask such that portions of the photoresist layer are exposed to the exposure source, whereby the photoresist layer comprises exposed regions;
   immersing the photoresist layer in a solution in which the exposed regions of the photoresist layer are soluble such that the exposed regions of the photoresist layer are removed, wherein portions of the masking layer are exposed; and
   etching the exposed portions of the masking layer.

8. The method of claim 7 wherein the photoresist layer is present during the implantation of the polysilicon layer.

9. The method of claim 7, further comprising removing the photoresist layer prior to forming a grown oxide layer.

10. The method of claim 1 wherein the impurity comprises an n-type impurity.

11. The method of claim 1 wherein the impurity is selected from the group consisting of arsenic and phosphorus.

12. The method of claim 1, further comprising removing the nitride layer prior to etching the gate material layer.

13. The method of claim 1, further comprising implanting an LDD area subsequent to the etching of the gate material layer.

14. The method of claim 1 or 13, further comprising implanting the source/drain region subsequent to the etching of the gate material layer, wherein the a source drain region is formed at a spaced distance from the gate conductor.

15. A method for forming a transistor, comprising:
   providing a semiconductor substrate comprising a dielectric layer, a gate material layer, and a masking layer sequentially formed upon the semiconductor substrate;
   forming an opening within the masking layer to define sidewall surfaces of the masking layer surrounding the opening;
   forming a pair of spacer structures laterally adjacent the sidewall surfaces such that the spacer structures substantially reduce the lateral width of the opening;
   implanting an impurity into a portion of the gate material layer laterally bounded by the spacer structures, wherein a source/drain region within the silicon substrate is substantially free of the impurity;
   forming a grown oxide layer in the portion of the gate material receiving the impurity; and
   etching the gate material layer to form a gate conductor, wherein the gate conductor is formed exclusively beneath the grown oxide layer.

16. The method of claim 15 wherein the dielectric layer comprises thermally grown silicon dioxide.

17. The method of claim 15 wherein the dielectric layer comprises chemical vapor deposited silicon dioxide.

18. The method of claim 15 wherein the gate material layer comprises polysilicon.

19. The method of claim 15 wherein the masking layer comprises silicon nitride.

20. The method of claim 15 wherein the masking layer comprises silicon nitride configured upon an oxide layer.

21. The method of claim 15 wherein the forming of an opening comprises:
   depositing a photoresist layer on an upper surface of the masking layer;
   directing an exposure source of the photolithography apparatus at the photoresist layer through a photomask such that portions of the photoresist layer are exposed to the exposure source, whereby the photoresist layer comprises exposed regions;
   immersing the photoresist layer in a solution in which the exposed regions of the photoresist layer are soluble such that the exposed regions of the photoresist layer are removed, wherein portions of the masking layer are exposed; and
   etching the exposed portions of the masking layer.

22. The method of claim 15 wherein forming the spacer structures comprises:
   depositing a spacer material across the silicon substrate and into the trench; and anisotropically etching the spacer layer to define the spacer structures.

23. The method of claim 15 wherein the impurity comprises an n-type impurity.

24. The method of claim 15 wherein the impurity is selected from the group consisting of arsenic and phosphorus.

25. The method of claim 15, further comprising removing the nitride layer prior to etching the gate material layer.

26. The method of claim 15, further comprising implanting an LDD area subsequent to the etching of the gate material layer.

27. The method of claim 15 or 26, further comprising implanting the source/drain region subsequent to the etching of the gate material layer, wherein the a source drain region is formed at a spaced distance from the gate conductor.

* * * * *